(12) United States Patent
May

(10) Patent No.: US 6,395,328 B1
(45) Date of Patent: May 28, 2002

(54) ORGANIC LIGHT EMITTING DIODE COLOR DISPLAY

(75) Inventor: Paul May, Dullingham (GB)

(73) Assignee: Cambridge Display Technology Limited (GB)

( * ) Notice: Subject to any disclaimer, the term of this patent is extended or adjusted under 35 U.S.C. 154(b) by 0 days.

(21) Appl. No.: 09/155,951

(22) PCT Filed: Apr. 10, 1997

(86) PCT No.: PCT/GB97/00995

§ 371 Date: Jul. 15, 1999

§ 102(e) Date: Jul. 15, 1999

(87) PCT Pub. No.: WO97/38445

PCT Pub. Date: Oct. 16, 1997

(30) Foreign Application Priority Data

Apr. 10, 1996 (GB) ............................................. 9607437
Feb. 10, 1997 (GB) ............................................. 9702662

(51) Int. Cl.[7] ............................................. H05B 33/10
(52) U.S. Cl. .................. 427/66; 428/917; 313/504; 257/89
(58) Field of Search ................... 428/690, 917, 428/201, 209, 212; 313/504, 505, 506, 510; 257/40, 89, 90, 103; 427/66

(56) References Cited

U.S. PATENT DOCUMENTS

| 5,247,190 A | | 9/1993 | Friend et al. | 257/40 |
|---|---|---|---|---|
| 5,294,869 A | | 3/1994 | Tang et al. | 313/504 |
| 5,424,560 A | | 6/1995 | Norman et al. | 257/40 |
| 5,693,962 A | * | 12/1997 | Shi et al. | 257/89 |
| 5,736,754 A | * | 4/1998 | Shi et al. | 257/89 |

FOREIGN PATENT DOCUMENTS

| EP | 0550062 A2 | 7/1993 |
|---|---|---|
| EP | 0705857 A2 | 4/1996 |
| EP | 0732868 A1 | 9/1996 |
| EP | 0734078 A2 | 9/1996 |
| WO | WO 92/03491 | 3/1992 |
| WO | WO 95/06400 | 3/1995 |
| WO | WO96/33516 | 10/1996 |

* cited by examiner

*Primary Examiner*—Marie Yamnitzky
(74) *Attorney, Agent, or Firm*—Finnegan, Henderson, Farabow, Garrett & Dunner

(57) ABSTRACT

A multi-color electroluminescent display has a plurality of discrete, laterally spaced areas of light emitting material formed over respective groups of first and second electrode regions. The light emissive material over each group is capable of emitting radiation of a different color. The multi-colored device is formed by a sequence of steps where each emitting layer is deposited as. a precursor which is susceptible to patterning and which is then converted into its polymer which is not susceptible to subsequent patterning steps. This allows a second color to be deposited on top of a first color, the second color being patterned while avoiding damage to the first color below it.

12 Claims, 3 Drawing Sheets

ORGANIC LIGHT EMITTING DIODE COLOR DISPLAY

FIELD OF THE INVENTION

The invention relates to multi-colour EL displays and a method of manufacture thereof.

BACKGROUND OF THE INVENTION

The most popular flat panel display technology currently in use is based on liquid crystal devices, which are effectively light shutters used in combination with illumination sources. In graphic displays there are many different pixels that must be independently driven. Typically this is achieved through matrix addressing, where each pixel is addressed by application of a suitable switching voltage applied between row and column conducting tracks on either side of the liquid crystal. Each row is selected by applying. a voltage to the row track, and individual pixels within the row selected by application of column data voltages to the column tracks. The rows are addressed sequentially, each for a line address time such that the whole frame is addressed within the Frame time. However, because the speed of switching of the liquid crystals is slow relative to the line addressing time, when video frame rates are required (<20 ms), special circuitry has to be typically added to each pixel. This arrangement is called active matrix addressing and often involves the use of thin-film transistors at each pixel. Because of the increased complexity of the active matrix displays they are much more expensive to make than passive matrix devices.

Organic electroluminescent devices are made from materials that emit light when a suitable voltage is applied across electrodes deposited on either side of the organic layer(s). One class of such materials is semiconductive conjugated polymers which have been described in our earlier U.S. Pat. No. 5,247,190, the contents of which are herein incorporated by reference. The metal electrodes can be patterned to form a matrix of rows and columns so that matrix addressing can take place. There are several potential advantages over liquid crystal graphic displays. Because the polymers are directly emissive, no backlight is required. Also polymers of different colours can be fabricated so that a suitably patterned matrix of polymers can be used for a colour display (multi-colour or full-colour RGB) without the use of colour filters as required by a liquid crystal display.

Our earlier applications (EP-A-94924916.3 and GB 9507862.2) show ways to achieve patterned emission of different colours. In these different embodiments the polymer materials are not themselves patterned and the emission patterns are defined by the intersection of the injecting electrodes. Multiple colour emission is possible through stacking of the emitting layers on top of each other in a vertical fashion. This approach results in a device fabrication process with many steps, but with low complexity for each step. Another U.S. Pat. No. 5,424,560 recently disclosed an approach for producing Organic LEDs where the emission areas are themselves patterned, avoiding the requirement for multiple electrode depositions. In this approach an emitting area of one colour is first patterned, and subsequently a material of different colour emission is deposited and patterned to form a separate emission area. This second layer covers the first emitting area and in that area of overlap acts as a transport layer. Thus no patterning above the first layer is required. This approach requires that the overlayers act as hole transport layers as well as emitters, so there is some compromise that must be made on their properties. The simplest structure would be made up of laterally-defined and separated LEP areas but it is not obvious how to pattern such a structure. Direct printing techniques (e.g. gravure) would be possible but the alignment tolerances required between different colours is probably beyond the resolution achievable in printing processes.

SUMMARY OF THE INVENTION

The problem can be solved if, as described herein, layers could be patterned to form emitting areas, but without disturbing previously patterned emitting areas of a different colour.

The present invention provides a method of fabricating a multi-colour electroluminescent display, comprising the steps of: forming on a substrate a plurality of first electrode regions; forming over a first selected group of said first electrode regions a first layer of a precursor for a first material for emitting radiation of a first colour, said precursor for said first material being susceptible to patterning; at least partially converting said precursor for said first material into said first material which is substantially resistant to subsequent patterning steps; depositing over said first layer and over at least a second selected group of said first electrode regions a second layer of a precursor for a second material for emitting radiation of a second colour, said precursor for said second material being susceptible to patterning; patterning said second layer to remove said second layer from above said first layer and leaving said second layer over said second selected group of said first electrode regions; at least partially converting said precursor for said second material into said second material; finally converting any partially-converted precursors into said respective materials; forming a plurality of second electrode regions over said layers in such a manner that said materials for emitting radiation can be selectively excited to emit radiation by applying an electric field between said first and second electrode regions.

Preferably, said step of forming a plurality of first electrode regions comprises the steps of: depositing a layer of a conductive material on a substrate; and patterning said layer of said conductive material to form a plurality of first electrode regions.

Preferably, said step of forming a first layer of a precursor for a first material comprises the steps of: depositing a layer of a precursor for a first material for emitting radiation of a first colour over said first electrode regions; and patterning said layer of said precursor for said first material to form a layer of said precursor for said first material over a first selected group of said first electrode regions.

Preferably, said step of forming a plurality of second electrode regions comprises the steps of: depositing a layer of a conductive material over said layers; and patterning said layer of conductive material to form a plurality of second electrode regions.

In one embodiment, said steps of at least partially converting said precursor for said second material into said second material and finally converting any partially-converted precursors for said first and second materials into said first and second materials are performed in a single step.

In another embodiment, said second material is substantially resistant to subsequent patterning steps, and said method further comprises, after said step of at least partially converting said precursor for said second material, the steps of: depositing over said first and second layers and over a third selected group of said first electrode regions a third layer of a precursor for a third material for emitting radiation of a third colour, said precursor for said third material being susceptible to patterning; patterning said third layer to remove said third layer from over said first and second layers and leaving said third layer over said third selected group of said first electrode regions; and at least partially converting said precursor for said third material into said third material.

Preferably, said steps of at least partially converting said precursor for said third material into said third material and finally converting any partially-converted precursors for said first, second and third materials into said first, second and third materials are performed in a single step.

Preferably, said method further comprises the step of depositing an electron transport layer prior to said step of forming said plurality of second electrode regions.

Preferably, said electron transport layer is a conjugated polymer layer.

Preferably, the thickness of said electron transport layer is from 5 to 200 nm.

Preferably, said method further comprises the step of depositing a hole blocking layer prior to said step of forming said plurality of second electrode regions.

Preferably, said hole blocking layer is a dielectric layer.

Preferably, the thickness of said hole blocking layer is from 1 to 10 nm.

Preferably, said first electrode regions are composed of a light-transmissive conductive material.

More preferably, said first electrode regions are composed of indium-tin oxide, tin oxide or zinc oxide.

Preferably, said second electrode regions are composed of Al or an alloy thereof.

Preferably, the thickness of said first electrode regions is from 10 to 500 nm.

Preferably, the thickness of said second electrode regions is from 10 to 1000 nm.

Preferably, each of said first and second electrode regions comprises a line.

More preferably, the width of each of said lines of said first electrode regions is from 10 to 5000 µm.

More preferably, the width of each of said lines of said second electrode regions is from 10 to 5000 µm.

More preferably, the spacing between each of said lines of said first electrode regions is from 10 to 5000 µm.

More preferably, the spacing between each of said lines of said second electrode regions is from 10 to 5000 µm.

More preferably, said first electrode regions are one of columns or rows and said second electrode regions are the other of columns or rows.

Preferably, said layers of precursor for each of said materials are formed to a thickness of from 10 to 500 nm.

Preferably, said materials for emitting radiation are polymer materials.

More preferably, said polymer materials are selected from poly.(p-phenylene vinylene) for a green colour, poly(p-phenylene) or poly(p-phenylene vinylene) co-polymer with non-conjugated sections for a blue colour, and poly(1,4-napthylene vinylene) or a dialkoxy substituted poly(p-phenylene vinylene) for a red colour;

the poly(p-phenylene) precursors comprising:
(i) poly(5,6 dialkyloxy-1,3 cyclohexadiene);
(ii) a polymer comprising recurring units of the general formula:

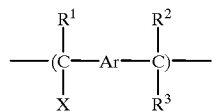

X denotes —$SR^3$, —$SO$—$R^3$, —$SO_2$—$R^3$, —$COOR^3$, —$NO_2$, —$CN$, —$CF_3$ or —$R^3$, $R^1$, $R^2$, $R^3$ are the same or different and denote —H, —$R^4$ or —X, $R^4$ denotes a straight chain or branched alkyl group with 1 to 20 carbon atoms, phenyl or benzyl, either of which can be substituted once or twice with —$R^3$, —$OR^1$, —$NO_2$, —$CN$, —$Br$, —$Cl$ or —$F$, and Ar denotes an aromatic system, comprising from 4 to 20 carbon atoms which can optionally be substituted;

(iii) a thiophene, furan, pyrrole or pyridine analogue of (i) or (ii); and (iv) one of (i), (ii) or (iii) with a monosubstitution or 2,5 disubstitution of alkcoxy, alkyl, aryloxy, aryl, nitrile, nitro or —$CF_3$ the poly(p-phenylene vinylene) precursor comprising:
(i) poly(p-xylylene-α-dialkyl sulphonium halide);
(ii) poly(p-xylylene-α-cycloalkyl sulphoniuum halide);
(iii) poly(p-xylylene-α-halide);
(iv) poly(p-xylylene-α-alkoxide) where the alkyl ether can contain a cross-linkable group;
(v) poly(p-xylylene-α-aryloxide) where the aromatic ester can be substituted by a cross-linkable group;
(vi) poly(p-xylylene-α-carboxylate) where the ester can be aliphatic or aromatic and contain a cross-linkable group;
(vii) a polymer comprising recurring units of the general formula:

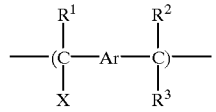

x denotes —$SR^3$, —$SO$—$R^3$, —$SO_2$—$R^3$, —$COOR^3$, —$NO_2$, —$CN$, —$CF_3$or —$R_3$, $R^1$, $R^2$, $R^3$ are the same or different and denote —H, —$R^4$ or —X, $R^4$ denotes a straight chain or branched alkyl group with 1 to 20 carbon atoms, phenyl or benzyl, either of which can be substituted once or twice with —$R^3$, —$OR^1$, —$NO_2$, —$CN$, —$Br$, —$Cl$ or —$F$, and Ar denotes an aromatic system, comprising from 4 to 20 carbon atoms which can optionally be substituted;

(viii) a thiophene, furan, pyrrole or pyridine analogue of any of (i) to (vii); and (ix) one of (i) to (viii) with a monosubstitution or 2,5 disubstitution of alkoxy, alkyl, aryloxy, aryl, nitrile, nitro or —$CF_3$ the poly(1,4-napthylene vinylene) precursor comprising:
(i) poly(1,4 benzoxylylene-α-dialkyl sulphonium halide);
(ii) poly(1,4 benzoxylylene-α-cycloalkyl sulphonium halide);

(iii) poly(1,4 benzoxylylene-α-halide);
(iv) poly(1,4 benzoxylylene-αalkoxide) where the alkyl ether can contain a cross-linkable group;
(v) poly (1,4 benzoxylylene-α-aryloxide) where the aromatic ester can be substituted by a cross-linkable group;
(vi) poly(1,4 benzoxylylene-α-carboxylate) where the ester can be aliphatic or aromatic and contain a cross-linkable group; and
(vii) a polymer comprising recurring units of the general formula:

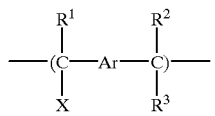

X denotes —$SR^3$, —SO—$R^3$, —$SO_2$—$R^3$, —$COOR^3$, —$NO_2$—CN, —$CF_3$ or —$R^3$,
$R^1$, $R^2$, $R^3$ are the same or different and denote —H, —$R^4$ or —X, —$R^4$ denotes a straight chain or branched alkyl group with 1 to 20 carbon atoms, phenyl or benzyl, either of which can be substituted once or twice with —$R^3$, —$OR^1$, —$NO_2$, —CN, —Br, —Cl or —F, and
Ar denotes an aromatic system, comprising from 4 to 20 carbon atoms which can optionally be substituted.

Preferably, said steps of patterning said precursor materials comprise steps of etching.

Preferably, said conversion steps comprise at least one of heat treatment, chemical treatment, electron beam exposure or radiation exposure.

More preferably, said conversion steps comprise a heat treatment at a temperature of from 50 to 300° C. in an inert atmosphere.

Still more preferably, said heat treatment is performed at about 150° C.

Preferably, said layers of said materials for emitting radiation are formed to cover said first electrode regions so as to electrically insulate said first electrode regions from said second electrode regions.

Preferably, said layers of said materials for emitting radiation each comprise a plurality of areas, each area overlying a respective one of said first electrode regions.

More preferably, said areas of material each comprise a plurality of discrete sub-areas and said second electrode regions are formed to overlie selected ones of said sub-areas.

The present invention also provides a multi-colour electroluminescent display, comprising:
a substrate;
a plurality of first electrode regions formed over said substrate;
a plurality of discrete, laterally-spaced areas of light-emissive material formed over said first electrode regions, wherein selected groups of said plurality of areas are each formed of a material for emitting radiation of a different colour and each individual first electrode region has only a material for emitting radiation of one colour formed thereover; and a plurality of second electrode regions formed over said plurality of light-emissive areas;
wherein said light-emissive areas can be selectively excited to emit radiation by applying an electric field between said first and second electrode regions; and wherein a multi-colour electroluminescent display, comprising:
a substrate;
a plurality of first electrode regions formed over said substrate;
a plurality of discrete, laterally-spaced areas of light-emissive material formed over said first electrode regions, wherein selected groups of said plurality of areas are each formed of a material for emitting radiation of a different colour and each individual first electrode region has only a material for emitting radiation of one colour formed thereover; and a plurality of second electrode regions formed over said plurality of light-emissive areas;
wherein said light-emissive areas can be selectively excited to emit radiation by applying an electric field between said first and second electrode regions; and wherein said light-emissive material has a precursor form which is susceptible to patterning but is itself substantially resistant to patterning.

Preferably, said device comprises a plurality of areas of a first material for emitting radiation of a first colour formed over a first selected group of said first electrode regions, a plurality of areas of a second material for emitting radiation of a second colour formed over a second selected group of said first electrode regions, and a plurality of areas of a third material for emitting radiation of a third colour formed over a third selected group of said first electrode regions.

More preferably, said. plurality of areas of said first, second and third materials are arranged such that each area of said plurality of areas of said second material is adjacent a respective one of said plurality of areas of said first material and a respective one of said plurality of areas of said third material.

Preferably, said device further comprises an electron transport layer between said plurality of light-emissive areas and said plurality of said second electrode regions.

Preferably, said electron transport layer is a conjugated polymer layer.

Preferably, the thickness of said electron transport layer is from 5 to 200 nm.

Preferably, said device further comprises a hole blocking layer between said plurality of light-emissive areas and said plurality of said second electrode regions.

Preferably, said hole blocking layer is a dielectric layer.

Preferably, the thickness of said hole blocking layer is from 1 to 10 nm.

Preferably, said first electrode regions are composed of a light-transmissive conductive material.

More preferably, said first electrode regions are composed of indium-tin oxide, tin oxide or zinc oxide.

Preferably, said second electrode regions are composed of Al or an alloy thereof.

Preferably, the thickness of said first electrode regions is from 10 to 500 nm.

Preferably, the thickness of said second electrode regions is from 10 to 1000 nm.

Preferably, each of said first and second electrode regions comprises a line.

More preferably, the width of each of said lines of said first electrode regions is from lo to 5000 μm.

More preferably, the width of each of said lines of said second electrode regions is from 10 to 5000 μm.

More preferably, the spacing between each of said lines of said first electrode regions is from 10 to 5000 μm.

More preferably, the spacing between each of said lines of said second electrode regions is from 10 to 5000 μm.

More preferably, said first electrode regions are one of columns or rows and said second electrode regions are the other of columns or rows.

Preferably, said areas of light-emissive material are each formed to a thickness of from 10 to 500 nm.

Preferably, said Materials for emitting radiation are polymer materials.

More preferably, said polymer materials are selected from poly (p-phenylezie vinylene) for a green colour, poly(p-phenylene) or poly(p-phenylene vinylene) co-polymer with non-conjugated sections for a blue colour, and poly(1,4-napthylene vinylene) or a dialkoxy substituted poly(p-phenylene vinylene) for a red colour.

Preferably, said areas of material for emitting radiation cover said first electrode regions so as to electrically insulate said first electrode regions from said second electrode regions.

Preferably, said areas of material for emitting radiation each overlie a respective one of said first electrode regions.

More preferably, said areas of material each comprise a plurality of discrete sub-areas and said second electrode regions are formed to overlie selected ones of said sub-areas.

It will be understood that in the context of the present invention a precursor of a material is to be construed broadly as encompassing any precursor from which the material can in any way be formed.

A method of manufacture of a colour polymer EL display is described herein wherein two or more precursor polymer materials are used to define the emitting areas and are deposited in sequence onto one electrode of the device, patterned and converted to their final form before deposition of the next polymer layer such that the converted polymers are not in any way damaged by the deposition, patterning or conversion of subsequent precursor layers.

In one embodiment of the invention, one colour is first deposited then lithographically defined, and finally converted to its final form. Subsequently other colours are deposited and lithographically defined before conversion. Conversion of the precursor occurs through heat treatment or chemical treatment or electron beam exposure or radiation exposure (including electromagnetic radiation) or some combination of these techniques.

In another embodiment of the invention the underlying electrode and/or the subsequently deposited top electrode are patterned to define area of emission from the converted polymers, and the area of overlap between the electrodes is chosen to ensure that there is always an emitting polymer layer between the two electrodes.

In another embodiment of the invention a further unpatterned layer is deposited on top of the patterned electroluminescent polymers and prior to the deposition of the final electrode, such layer being either a charge transport layer or a very thin dielectric layer whose thickness and constitution is chosen to increase the overall efficiency of the EL device; the area of overlap between the electrodes is chosen to ensure that there is always an emitting polymer layer between the two electrodes.

The underlying mechanism that causes the precursor polymer to be changed into its final robust form can include scission of solubilising side groups or cross-linking of side groups on different polymer chains. Lithographic definition can take place through the use of compatible photoresists (i.e. that can be put down without disturbing the underlying layer) followed by masked exposure and development. Also possible is partial conversion using masked UV exposure prior to development and removal of the unwanted areas followed by a full conversion. The full conversion can be performed prior to the deposition of the next precursor polymer, or after any subsequent polymers have been patterned depending on the effect of subsequent solvents on the partially converted material. The final form of the polymers is insoluble in subsequent solvents. A final unpatterned layer can be subsequently deposited over all the emitting areas to improve efficiency.

For a better understanding of the present invention and to show how the same may be carried into effect, reference will now be made by way of example to the accompanying drawings.

DESCRIPTION OF THE PREFERRED EMBODIMENT

Figure 1:
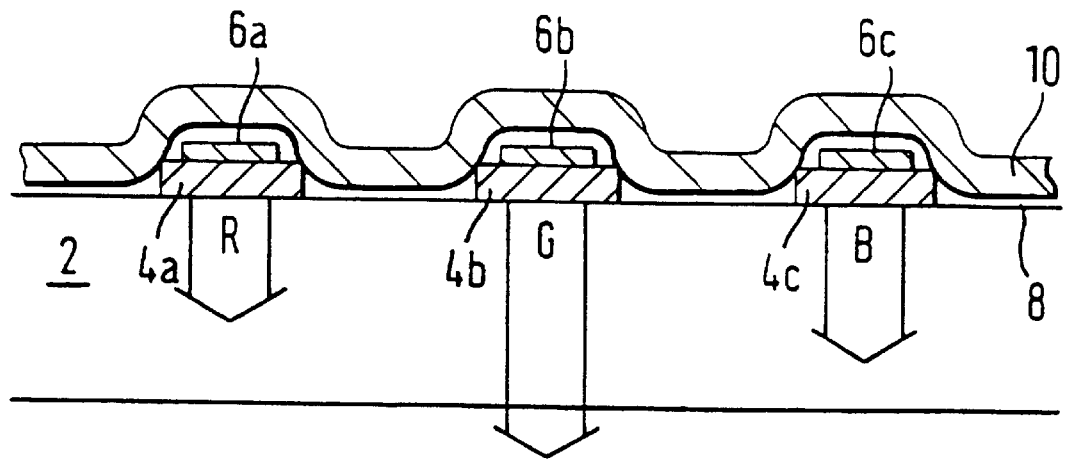
FIG. 1 is a schematic section through part of a multi-colour device.

A specific embodiment that uses three precursors to red, green and blue emitters is now described. The final structure after processing is shown in FIG. 1. The structure comprises a glass substrate 2 with patterned regions of a transparent electrode, which in the preferred embodiment is indium tin oxide. The strips define columns of the RGB dot-matrix architecture. As can be appreciated from the view of FIG. 4, in the final structure these represent strips of indium tin oxide. The strips are denoted in FIG. 1 by the reference numerals 4a, 4b and 4c. On top of each strip of indium tin oxide is a strip of a light emitting polymer. The polymers atop the strips 4a, 4b and 4c respectively emit light of different wavelengths, red, green and blue as illustrated. The red emitting polymer strip 6a lies on top of ITO strip 4a. The green emitting polymer 6b lies on top of ITO strip 4b. The blue emitting polymer strip 6c lies on top of ITO strip 4c. The respective wavelengths of emission are indicated by the capital letters on the arrows. An optional electron transport/hole blocking layer extends crosswise and over the strips 4a, 4b and 4c. When the electron transport/hole blocking layer 8 is present the polymer strips can be narrower than the ITO strips. Atop this, lie a plurality of aluminum electrode strips 10. Once again, as can be seen from FIG. 4 the aluminum electrode strips 10 and the electron transport/hole blocking layer extend crosswise to define rows of the dot matrix architecture. Each of the light emitting polymer strips 6a, 6b, 6c is derived from a respective precursor.

The structure of FIG. 1 is manufactured in accordance with the following steps.

A layer of indium tin oxide is patterned on the glass substrate 2 to form the indium tin oxide strips 4a, 4b and 4c. A layer of a first precursor is formed over a first selected group of the ITO portions, that is those which are to excite emission of a first colour. For example, in the preferred embodiment the precursor to the red emitting polymer could be put down first. That precursor is susceptible to patterning, for example by etching, in its precursor form but, when converted or partially converted into its final polymer is substantially resistant to subsequent patterning steps. After being put down over the first selected group of ITO portions, the precursor is at least partially converted into its red emitting polymer.

Then, a second precursor material is deposited over the first layer and over a second selected group of ITO portions. For example, the precursor to the green emitting polymer could next be deposited. That precursor is also susceptible to patterning, for example by etching, in its precursor form but is substantially resistant to patterning when at least partially converted. Thus, the second layer can be patterned while in its precursor form to remove it from above the first layer, but leaving the second layer over the second selected group of ITO portions. Then, the second precursor is at least partially converted into the green emitting polymer. Similar steps are carried out for the blue emitting polymer. Finally, any unconverted precursors are converted into their respective polymers.

It will readily be appreciated that the precursors can be fully converted after being deposited and patterned.

Figure 2:
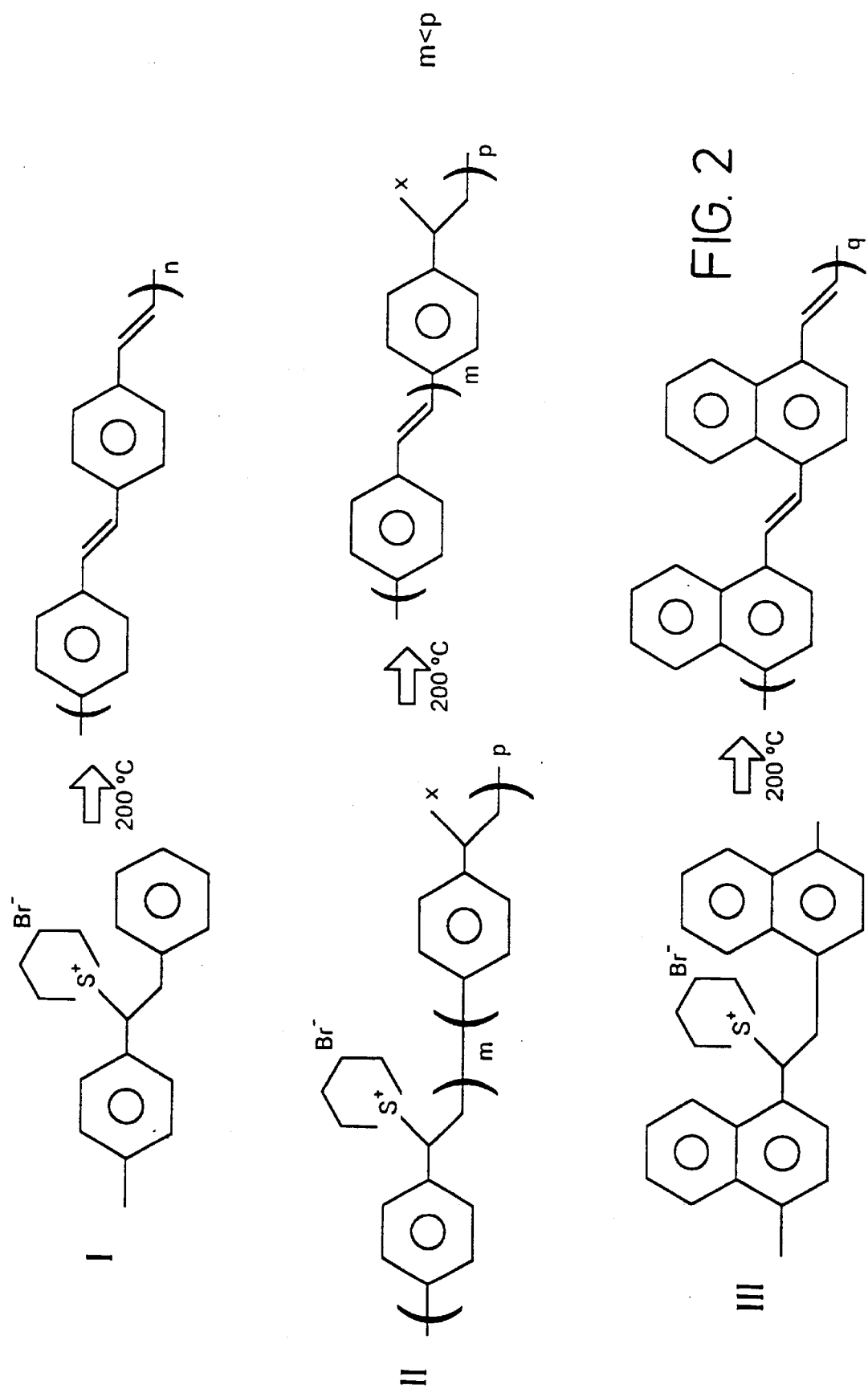
FIG. 2 is formulae of side-group leaving precursor materials for red, green and blue precursors and final polymer forms at a conversion temperature of 200° C.

The order in which the precursors are put down may not be significant, though the materials with the most severe conversion conditions should be processed first (i.e. to minimize the damage to previously deposited emitting areas). The three precursors are shown in FIG. 2 (Formulae I, II and III) The green emitter precursor (Formula I) is a polyphenylenevinylene (PPV) polymer with a tetrahydrathiophene leaving group and bromine counter ion. Conversion in an inert atmosphere can be effected at between 150 and 200° C. The blue emitter (Formula II) is a block copolymer which limits the conjugation length of the PPV monomer and thereby shifts the emission wavelength into the blue. For example, the blue copolymer is a PPV copolymer with conjugated sections. Similar conversion conditions to the green emitter are required. Finally a red emitting precursor (Formula III) is shown based on a polynaphthalene polymer with a tetrahydrathiophene leaving group and bromine counter ion. Again, similar conversion conditions to the green emitter are required.

Figure 4:
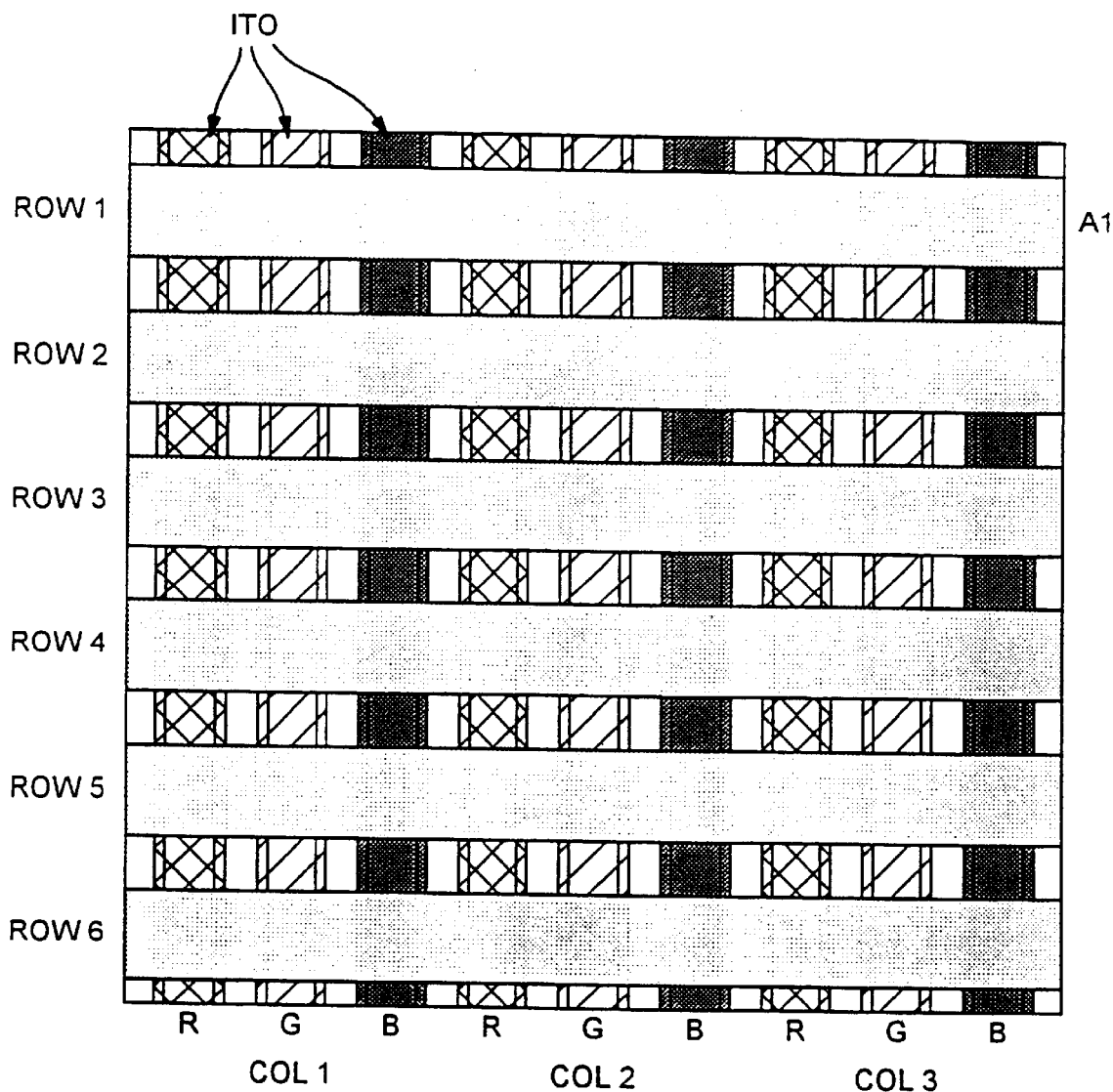
FIG. 4 is a RGB dot-matrix architecture.

In this specific embodiment the ITO is patterned as lines (columns of a passive matrix display) and the subsequent precursor polymers are patterned as parallel lines each associated with a single ITO line, and each slightly wider so that the ITO lines are completely covered as in FIG. 4. Finally the top electrode (e.g. aluminum) is deposited as orthogonal rows. Such a display can be addressed by applying data voltages to the columns and by sequential row selection so that within each selected row the required pixel/colour combinations are switched on.

Figure 3:
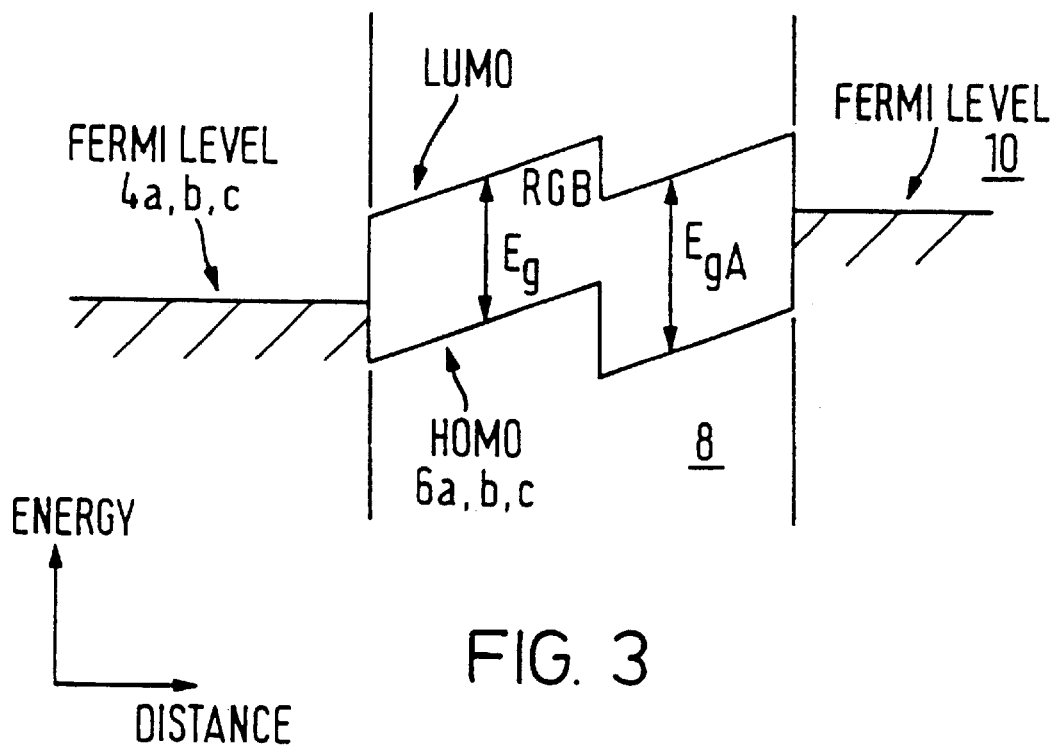
FIG. 3 is an energy band diagram.

Alternatively before depositing the top electrode the optional second layer 8 above the RGB emitters can be added, both to help prevent shorting of the top contact to the ITO at the edge of the top electrode, and to increase the efficiency of emission. A conjugated polymer electron transport layer with a bandgap $E_{gA}$ as shown in FIG. 3 can be used but may cause differential efficiency from each of the RGB areas. In the described embodiment $E_{gA} > E_g^B > E_g^G > E_g^R$ where $E_g^{BRG}$ represents the energy gap of the blue red or green polymers respectively. In FIG. 3, LUMO represents the lowest unoccupied molecular orbital and HOMO represents the highest occupied molecular orbital. Preferred is a thin dielectric layer (of order 10–100 Å thick) which allows electron injection from the cathode by tunnelling, but blocks holes from moving to the cathode as well as preventing any shorting or current flow between the top cathode and the ITO in areas where there is no emitting polymer. Because the dielectric has a high energy bandgap, it also has similar barrier properties with respect to each of the emitters and therefore will enhance the efficiencies of all the colour emitters.

What is claimed is:

1. A method of fabricating a multi-colour electroluminescent display, comprising the steps of:

forming on a substrate a plurality of first electrode regions;

forming over a first selected group of said first electrode regions a first layer of a precursor for a first organic polymeric material for emitting radiation of a first colour, said precursor for said first material being susceptible to patterning, at least partially converting said precursor for said first material into said first material, the product of the at least partially converted precursor being substantially resistant to subsequent patterning steps;

depositing over said first layer and over at least a second selected group of said first electrode regions a second layer of a precursor for a second organic polymeric material for emitting radiation of a second colour, said precursor for said second material being susceptible to patterning;

patterning said second layer to remove said second layer from above said first layer and leaving said second layer over said second selected group of said first electrode regions;

at least partially converting said precursor for said second material into said second material;

finally converting any partially-converted precursors into said respective materials;

forming a plurality of second electrode regions over said layers in such a manner that said materials for emitting radiation can be selectively excited to emit radiation by applying an electric field between said first and second electrode regions.

2. A method of fabricating a multi-colour electroluminescent display according to claim 1, wherein said step of forming a plurality of first electrode regions comprises the steps of:

depositing a layer of a conductive material on a substrate; and patterning said layer of said conductive material to form a plurality of first electrode regions.

3. A method of fabricating a multi-colour electroluminescent display according to claim 2, wherein said step of forming a first layer of a precursor for a first material comprises the steps of:

depositing a layer of a precursor for a first material for emitting radiation of a first colour over said first electrode regions; and patterning said layer of said precursor for said first material to form a layer of said precursor for said first material over a first selected group of said first electrode regions.

4. A method of fabricating a multi-colour electroluminescent display according to claim 2, wherein said step of forming a plurality of second electrode regions comprises the steps of:

depositing a layer of a conductive material over said layers; and patterning said layer of conductive material to form a plurality of second electrode regions.

5. A method of fabricating a multi-colour electroluminescent display according to claim 1, wherein said step of forming a first layer of a precursor for a first material comprises the steps of:

depositing a layer of a precursor for a first material for emitting radiation of a first colour over said first electrode regions; and patterning said layer of said precursor for said first material to form a layer of said precursor for said first material over a first selected group of said first electrode regions.

6. A method of fabricating a multi-colour electroluminescent display according to claims 1, wherein said step of forming a plurality of second electrode regions comprises the steps of:
  depositing a layer of a conductive material over said layers; and
  patterning said layer of conductive material to form a plurality of second electrode regions.

7. A method of fabricating a multi-colour electroluminescent display according to claim 1, wherein said steps of at least partially converting said precursor for said second material into said second material and finally converting any partially-converted precursors for said first and second materials into said first and second materials are performed in a single step.

8. A method of fabricating a multi-colour electroluminescent display according to claim 1, wherein the product of at least partially converting said precursor for said second material is substantially resistant to subsequent patterning steps, and further comprising, after said step of at least partially converting said precursor for said second material, the steps of:
  depositing over said first and second layers and over a third selected group of said first electrode regions a third layer of a precursor for a third organic polymeric material for emitting radiation of a third colour, said precursor for said third material being susceptible to patterning;
  patterning said third layer to remove said third layer from over said first and second layers and leaving said third layer over said third selected group of said first electrode regions; and
  at least partially converting said precursor for said third material into said third material.

9. A method of fabricating a multi-colour electroluminescent display according to claim 8, wherein said steps of at least partially converting said precursor for said third material into said third material and finally converting any partially-converted precursors for said first, second and third materials into said first, second and third materials are performed in a single step.

10. A method of fabricating a multi-colour electroluminescent display according to claim 1, wherein said polymer materials are selected from poly(p-phenylene vinylene) for a green colour, poly(p-phenylene) or poly(p-phenylene vinylene) co-polymer with non-conjugated sections for a blue colour, poly(1,4-naphthylene vinylene) or a dialkoxy substituted polyp-phenylene vinylene) for a red colour;
  the poly(p-phenylene) precursors comprising:
    (a)(i) poly(5,6 dialkyloxy—1,3 cyclohexadiene) with an optional monosubstitution or 2,5 disubstitution of alkoxy, alkyl, aryloxy, aryl, nitrile, nitro or —$CF_3$
  the poly(p-phenylene vinylene) precursor comprising:
    (b)(i) poly(p-xylylene-α-dialkyl sulphonium halide);
    (b)(ii) poly(p-xylylene-α-cycloalkyl sulphonium halide);
    (b)(iii) poly(p-xylylene-α-halide);
    (b)(iv) poly(p-xylylene-α-alkoxide) where the alkyl ether can contain a cross-linkable group;
    (b)(v) poly(p-xylylene-α-aryloxide) where the aromatic ester can be substituted by a cross-linkable group;
    (b)(vi) poly(p-xylylene-α-carboxylate) where the ester can be aliphatic or aromatic and contain a cross-linkable group;
    (b)(vii) a polymer comprising recurring units of the general formula:

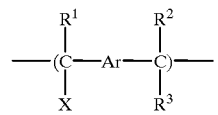

X denotes —$SR^3$, —SO—$R^3$, —$SO_2$—$R^3$, —$COOR^3$, —$NO_2$, —CN, —$CF_3$ or —$R^3$,
  $R^1$, $R^2$, $R^3$ are the same or different and denote —H, —$R^4$ or —X,
  $R^4$ denotes a straight chain or branched alkyl group with 1 to 20 carbon atoms, phenyl or benzyl, either of which can be substituted once or twice with —$R^3$, —$OR^1$, —$NO_2$, —CN, —Br, —Cl or —F, and
  Ar denotes a phenylene group which can optionally be substituted; or
    (b)(viii) one of (b)(i) to (b)(vii) with a monosubstitution or 2,5 disubstitution of alkoxy, alkyl, aryloxy, aryl, nitrile, nitro or —$CF_3$
  the poly(1,4-naphthylene vinylene) precursor comprising:
    (c)(i) poly(1,4 benzoxylylene-α-dialkyl sulphonium halide);
    (c)(ii) poly(1,4 benzoxylylene-α-cycloalkyl sulphonium halide);
    (c)(iii) poly(1,4 benzoxylylene-α-halide)
    (c)(iv) poly(1,4 benzoxylylene-α-alkoxide) where the alkyl ether can contain a cross-linkable group;
    (c)(v) poly(1,4 benzoxylylene-α-aryloxide) where the aromatic ester can be substituted by a cross-linkable group;
    (c) (vi) poly(1,4 benzoxylylene-α-carboxylate) where the ester can be aliphatic or aromatic and contain a cross-linkable group; and
    (c) (vii) a polymer comprising recurring units of the general formula:

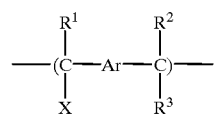

X denotes —$SR^3$, —SO—$R^3$, —$SO_2$—$R^3$, —$COOR^3$, —$NO_2$, —CN, —$CF_3$ or —$R^3$,
  $R^1$, $R^2$, $R^3$ are the same or different and denote —H, —$R^4$, or —X,
  $R^4$ denotes a straight chain or branched alkyl group with 1 to 20 carbon atoms, phenyl or benzyl, either of which can be substituted once or twice with —$R^3$, —$OR^1$, —$NO_2$, —CN, —Br, —Cl or —F, and
  Ar denotes a naphthalene group which can optionally be substituted.

11. A method of fabricating a multi-colour electroluminescent display according to claim 1, wherein said polymer materials are selected from the group consisting of thiophene, furan, pyrrole and pyridine polymers, the precursors comprising a thiophene, furan, pyrrole or pyridine analogue of
  (i) poly(5,6-dialkyloxy-1,3-cyclohexadiene);
  (ii) poly(p-xylylene-α-dialkyl sulphonium halide);
  (iii) poly(p-xylylene-α-cycloalkyl sulphonium halide);
  (iv) poly(p-xylylene-α-halide);
  (v) poly(p-xylylene-α-alkoxide), where the alkylether can contain a cross-linkable group;

(vi) poly(p-xylylene-α-aryloxide), where the aromatic ester can be substituted by a cross-linkable group;

(vii) poly(p-xylylene-α-carboxylate), where the ester can be aliphatic or aromatic and contain a cross-linkable group; or (viii) one of (i) to (vii) with a monosubstitution or 2, 5 disubstitution of alkoxy, alkyl, aryloxy, aryl, nitrile, nitro or —$CF_3$.

12. A method of fabricating a multi-colour electroluminescent display according to claim 1, wherein said polymer materials are selected from the group consisting of thiophene, furan, pyrrole and pyridine polymers, the precursor comprising a polymer comprising recurring units of the following general formula:

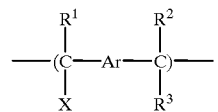

X denotes —$SR^3$, —SO—$R^3$, —$SO_2$—$R^3$, —$COOR^3$, —$NO_2$, —CN, —$CF_3$ or —$R^3$, $R^1, R^2, R^3$ are the same or different and denote —H, —$R^4$ or —X, $R^4$ denotes a straight chain or branched alkyl group with 1 to 20 carbon atoms, phenyl or benzyl, either of which can be substituted once or twice with —$R^3$, —$OR^1$, —$NO_2$, —CN, —Br, —Cl or —F, and Ar denotes a furan, thiophene, pyrrole or pyridine system which can optionally be substituted.

* * * * *

UNITED STATES PATENT AND TRADEMARK OFFICE
CERTIFICATE OF CORRECTION

PATENT NO.      : 6,395,328 B1                                              Page 1 of 1
DATED           : May 28, 2002
INVENTOR(S)     : Paul May It is certified that error appears in the above-identified patent and that said Letters Patent is hereby corrected as shown below:

<u>Title page,</u>
Item [57], ABSTRACT,
Line 7, after "as", delete the period.

<u>Column 11,</u>
Line 2, "claims" should read -- claim --.
Line 48, "polyp-phenylene vinylene)" should read -- poly(p-phenylene vinylene) --.

<u>Column 12,</u>
Line 33, before "(vi)", delete the space.
Line 36, before "(vii)", delete the space.

Signed and Sealed this

Twenty-third Day of July, 2002

*Attest:*

*Attesting Officer*

JAMES E. ROGAN
*Director of the United States Patent and Trademark Office*